(12) United States Patent
Kang et al.

(10) Patent No.: US 8,259,490 B2
(45) Date of Patent: Sep. 4, 2012

(54) MULTI-LEVEL PHASE-CHANGE MEMORY DEVICE AND METHOD OF OPERATING SAME

(75) Inventors: Yong Hoon Kang, Seoul (KR); Dong Yang Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 92 days.

(21) Appl. No.: 12/905,311

(22) Filed: Oct. 15, 2010

(65) Prior Publication Data

US 2011/0122685 A1 May 26, 2011

(30) Foreign Application Priority Data

Nov. 25, 2009 (KR) .................. 10-2009-0114728

(51) Int. Cl.
*G11C 11/00* (2006.01)
(52) U.S. Cl. ............. 365/163; 365/148; 977/754
(58) Field of Classification Search .............. 365/46, 365/94, 100, 113, 129, 148, 163; 257/2–5, 257/9, 296, 310, E21.35, E31.047, E27.006; 438/29, 95, 96, 166, 135, 240, 259, 365, 438/482, 486, 597, 785; 977/754
See application file for complete search history.

(56) References Cited

U.S. PATENT DOCUMENTS

| 2007/0153563 A1* | 7/2007 | Nirschl | 365/148 |
| 2008/0320209 A1* | 12/2008 | Lee et al. | 711/103 |
| 2009/0213644 A1* | 8/2009 | Parkinson | 365/163 |
| 2010/0058127 A1* | 3/2010 | Terao et al. | 714/718 |

* cited by examiner

*Primary Examiner* — Richard Elms
*Assistant Examiner* — Harry W Byrne
(74) *Attorney, Agent, or Firm* — Volentine & Whitt, PLLC

(57) ABSTRACT

A multi-level cell (MLC) phase-change memory device divides data into data groups each comprising multiple bits of data, and stores each of the data groups in a selected phase-change memory cell. A data group is stored in a selected phase-change memory cell by applying a pulse current to the selected phase-change memory cell with a pulse current characteristic corresponding to a data value of the data group. The pulse current characteristic can comprise, for instance, a magnitude, downward slope, or duration of the pulse current. Data is read from a selected phase-change memory cell by sensing a voltage of a bitline connected to the selected phase-change memory cell and comparing the sensed voltage simultaneously with a plurality of reference voltages.

10 Claims, 12 Drawing Sheets

MULTI-LEVEL PHASE-CHANGE MEMORY DEVICE AND METHOD OF OPERATING SAME

CROSS-REFERENCE TO RELATED APPLICATIONS

This application claims priority under 35 U.S.C. §119 to Korean Patent Application No. 10-2009-0114728 filed on Nov. 25, 2009, the disclosure of which is hereby incorporated by reference in its entirety.

BACKGROUND

Embodiments of the inventive concept relate generally to electronic memory technologies. More particularly, embodiments of the inventive concept relate to phase-change memory devices, and techniques for reading and writing data in multi-level cell phase-change memory devices.

Nonvolatile memory devices come in a variety of forms, including read only memory (ROM), electrically erasable programmable read only memory (EEPROM), flash memory, and phase-change memory, to name but a few. These and other types of nonvolatile memory have been under constant development in recent years in efforts to improve their storage capacity, operating speed, reliability, and other characteristics.

One area of development in nonvolatile memory devices involves storing larger amounts of data in individual memory cells. As examples, certain flash memory devices and phase-change memory devices have been designed to store multiple bits of data in each memory cell. Such devices are referred to as multi-level cell (MLC) nonvolatile memory devices, e.g., MLC flash memory devices, and MLC phase-change devices.

Although storing multiple bits per memory cell can improve the storage capacity of certain nonvolatile memory devices, it can also complicate program and read operations in a variety of ways. For instance, it can increase the amount of time and power required to perform the read and program operations, and it can decrease the reliability of the read and program operations. Consequently, researchers continue to explore ways to improve the operating characteristics of MLC nonvolatile memory devices.

SUMMARY

Some embodiments of the inventive concept provide MLC phase-change memory devices that improve the speed of read and program operations by performing these operations on groups of data.

According to an embodiment of the inventive concept, an MLC phase-change memory device comprises a phase-change memory cell array comprising a plurality of phase-change memory cells each configured to store multiple bits of data using variable resistance characteristics of a phase change material, an input/output buffer configured to receive data to be stored in the phase-change memory cell array, divide the data into data groups each comprising multiple bits, and output the data groups, and a write driver configured to generate a pulse current with a pulse current characteristic corresponding to a data value of one of the data groups, and to output the pulse current to a selected phase-change memory cell in the phase-change memory cell array.

In certain embodiments, the pulse current characteristic is a pulse current magnitude. In certain embodiments, the pulse current characteristic is a downward slope. In certain embodiments, the pulse current characteristic is a pulse current duration.

In certain embodiments, the phase-change memory cells each store two-bit data, and the pulse current characteristic has four different states that can be used to store four different values of the two-bit data.

In certain embodiments, the MLC phase-change memory device further comprises a sensing block configured to sense a voltage of a bit line connected to the selected phase-change memory cell, simultaneously compare the sensed voltage with a plurality of reference voltages, and identify data stored in the selected phase-change memory cell based on the comparison.

In certain embodiments, the sensing block senses the voltage of the bit line following a predetermined time interval after the bit line is connected to the selected phase-change memory cell.

In certain embodiments, the sensing block comprises a reference voltage generator configured to generate the plurality of reference voltages, and a sense amplifier configured to simultaneously compare the sensed voltage with the plurality of reference voltages and sense and output the data stored in the selected phase-change memory cell based on the comparison.

In certain embodiments, each bit of data stored in the selected phase-change memory cell has a distinct address.

In certain embodiments, the phase change material comprises a chalcogenide alloy of germanium, antimony and tellurium.

According to another embodiment of the inventive concept, a method is provided for operating an MLC phase-change memory device comprising a plurality of phase-change memory cells each configured to store multiple bits using variable resistance characteristics of a phase change material. The method comprises receiving data to be stored in the phase-change memory cell array, dividing the data into data groups each comprising multiple bits of data, generating a pulse current with a pulse current characteristic corresponding to a data value represented by one of the data groups, and outputting the pulse current to a selected phase-change memory cell to change a resistance of the selected phase-change memory cell to a state corresponding to the data value.

In certain embodiments, each of the data groups has a number of bits corresponding to a storage capacity of a corresponding phase-change memory cell.

In certain embodiments, the pulse current characteristic is a magnitude corresponding to the data value.

In certain embodiments, the pulse current characteristic is a downward slope corresponding to the data value.

In certain embodiments, the pulse current characteristic is a duration corresponding to the data value.

According to another embodiment of the inventive concept, a method is provided for operating an MLC phase-change memory device comprising a plurality of phase-change memory cells each storing multiple bits using variable resistance characteristics of a phase change material. The method comprises sensing a voltage of a bit line connected to a selected phase-change memory cell in the phase-change memory cell array, simultaneously comparing the sensed voltage with a plurality of reference voltages, and identifying a data value stored in the selected phase-change memory cell based on the comparison.

In certain embodiments, the sensed voltage of the bit line is sensed following a predetermined time interval after the bit line is charged with a precharge voltage and connected to the selected phase-change memory cell.

In certain embodiments, the method further comprises receiving data to be stored in the phase-change memory cell array, dividing the data into data groups each comprising multiple bits of data, and generating a pulse current with a pulse current characteristic corresponding to a data value represented by one of the data groups, and outputting the pulse current to a selected phase-change memory cell to change a resistance of the selected phase-change memory cell to a state corresponding to the data value.

In certain embodiments, the program pulse characteristic comprises a magnitude, a downward slope, or duration of the pulse current.

In certain embodiments, the selected phase-change memory cell is a 2-bit memory cell.

BRIEF DESCRIPTION OF THE DRAWINGS

The drawings illustrate selected embodiments of the inventive concept. In the drawings, like reference numbers indicate like features.

DETAILED DESCRIPTION OF EMBODIMENTS

Embodiments of the inventive concept are described below with reference to the accompanying drawings. These embodiments are presented as teaching examples and should not be construed to limit the scope of the inventive concept.

In the description that follows, where an element is referred to as being "connected" or "coupled" to another element, it can be directly connected or coupled to the other element or intervening elements may be present. In contrast, where an element is referred to as being "directly connected" or "directly coupled" to another element, there are no intervening elements present. As used herein, the term "and/or" includes any and all combinations of one or more of the associated listed items and may be abbreviated as "/".

The terms first, second, etc. are used herein to describe various elements, but the described elements should not be limited by these terms. Rather, these terms are used merely to distinguish one element from another. For example, a first signal could be termed a second signal, and, similarly, a second signal could be termed a first signal without departing from the teachings of the disclosure.

The terminology used herein is for the purpose of describing particular embodiments and is not intended to be limiting of the inventive concept. As used herein, the singular forms "a", "an" and "the" are intended to include the plural forms as well, unless the context clearly indicates otherwise. The terms "comprises" and/or "comprising," or "includes" and/or "including", where used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms used herein (including technical and scientific terms) have the same meaning as commonly understood by one of ordinary skill in the art to which the inventive concept belongs. Terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
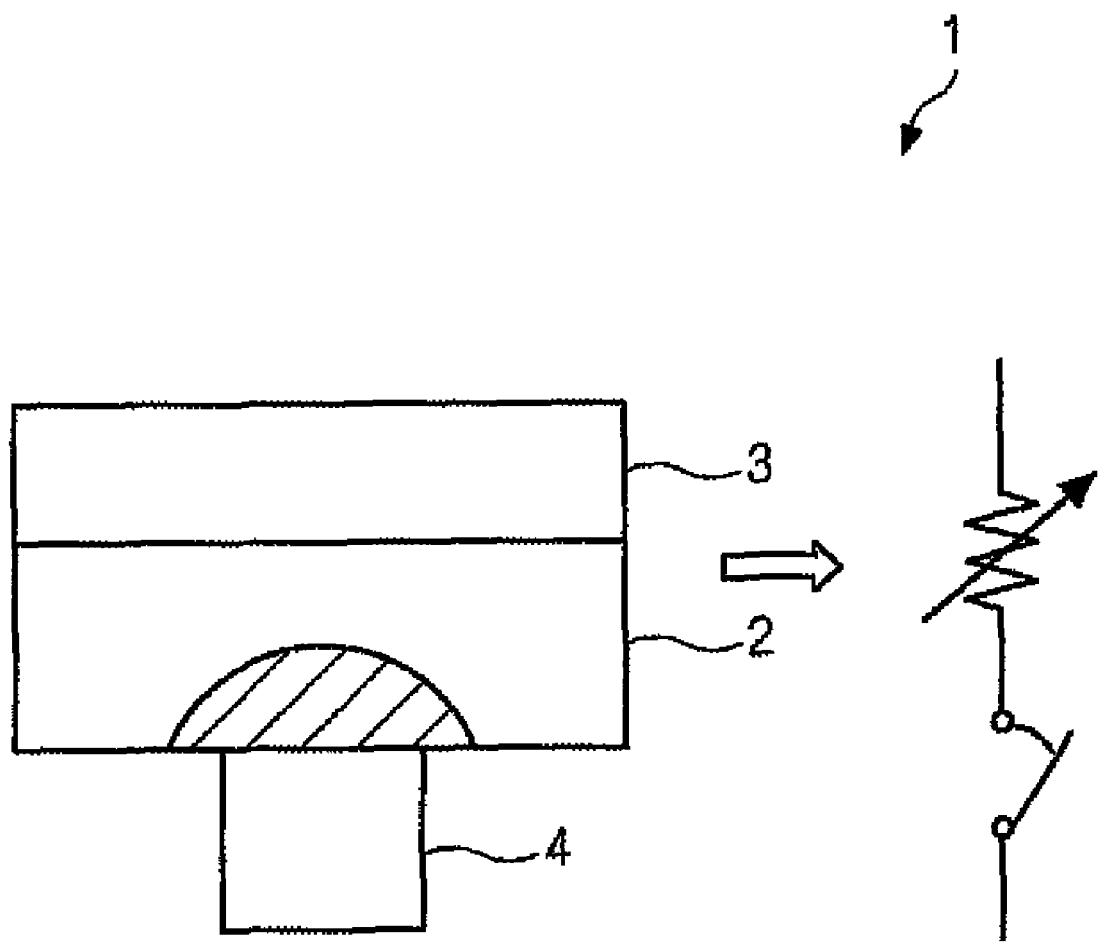
FIG. 1 is a diagram illustrating an example of a phase-change memory cell.

FIG. 1 is a diagram illustrating an example of a phase-change memory cell 1. Phase-change memory cell 1 comprises a phase-change layer 2 formed of a phase-change material, a top electrode 3 formed on one surface of phase-change layer 2, and a bottom electrode 4 formed on another surface of phase-change layer 2. A pulse current is applied to top electrode 3 and flows into bottom electrode 4.

The phase-change material can be changed between different states having different electrical properties. As an example, the phase-change material can comprise a chalcogenide alloy of germanium, antimony and tellurium (GeSbTe), also called a GST material. The GST material has an amorphous state with a relatively high resistivity, and a crystalline state with a lower resistivity. The GST material can be changed between the amorphous and crystalline states by heating and cooling it using electrical currents. Phase-change memory cell 1 stores data based on the resistivity of the phase-change material.

As indicated by a diagram on the right side of FIG. 1, phase-change memory cell 1 can be symbolized by a variable resistance element and a switching element. The switching element can be implemented using various components such as a metal-oxide semiconductor (MOS) transistor and a diode.

Figure 2:
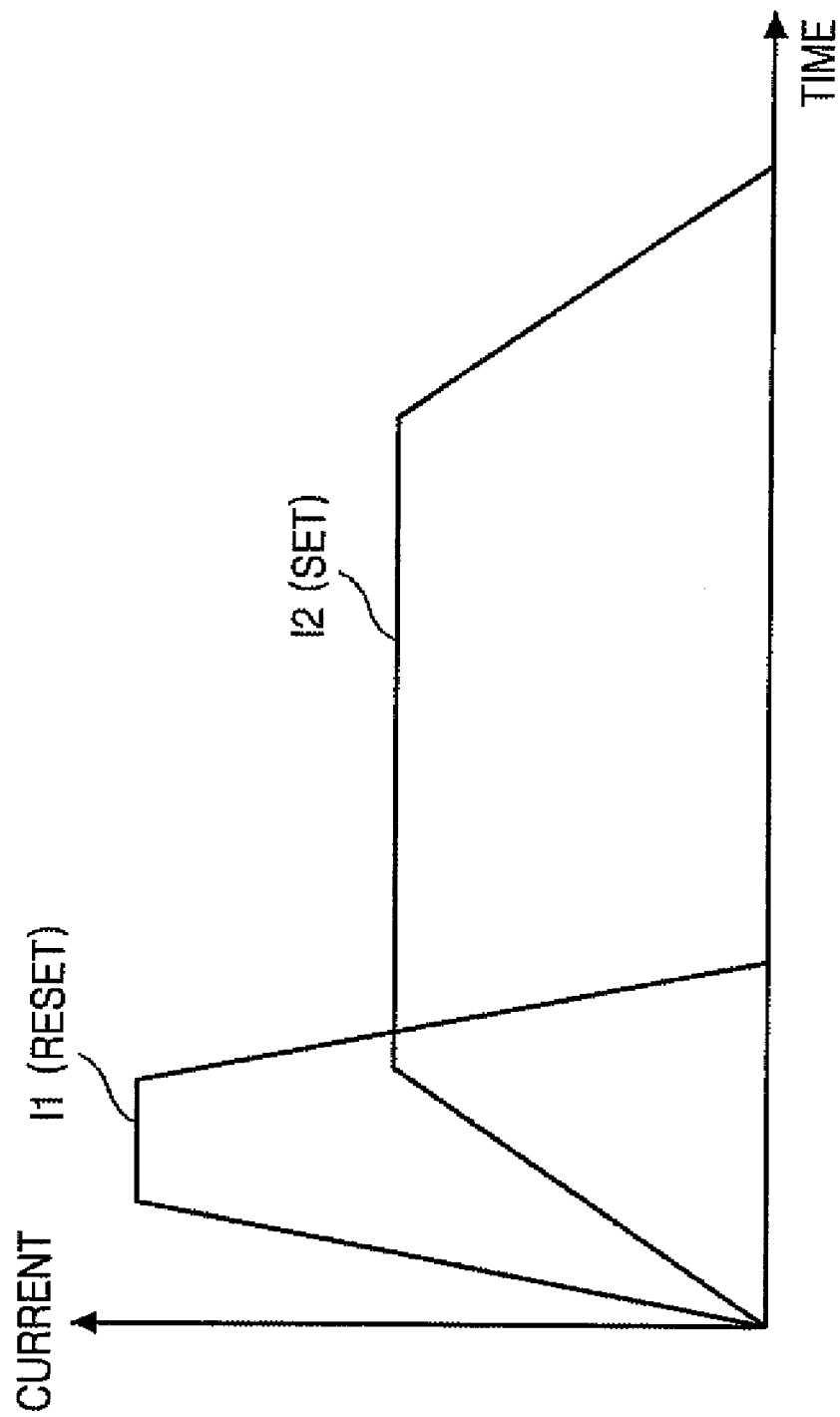
FIG. 2 is a graph illustrating a method of programming a phase-change memory cell using a pulse current.

FIG. 2 is a graph illustrating a method of programming phase-change memory cell 1 using a pulse current. The operation of phase-change memory cell 1 will be described with reference to FIGS. 1 and 2.

Where a pulse current I1 having a relatively large magnitude and a narrow width (e.g., several nanoseconds) is applied to phase-change memory cell 1, a portion of phase-change layer 2 adjacent to bottom electrode 4 is heated. Due to a difference in a heating profile, the portion of phase-change layer 2 (see hatched portion in FIG. 1) is placed in the crystalline state, but other portions of phase-change layer 2 remain in the amorphous state. On the other hand, where a pulse current I2 having a relatively small magnitude and a wide width (e.g., several tens of nanoseconds) is applied to phase-change memory cell 1, phase-change layer 2 is entirely crystallized.

The resistance of phase-change memory cell 1 is greater where phase-change layer 2 is in the amorphous state than where phase-change layer 2 is in the crystalline state. The high resistance (or amorphous) state of phase-change layer 2 can be defined as a reset state representing a logical "1" and the low resistance (or crystalline) state of phase-change layer 2 is defined as a set state representing a logical "0".

Alternatively, intermediate resistance states can be used to represent more than one bit of data. For instance, a first state where none of phase-change layer 2 is in the crystalline state can be used to represent a logical "11", a second state where a small portion of phase-change layer 2 is in the crystalline state can be used to represent a logical "10", a third state where a larger portion of phase-change layer 2 is in the crystalline state can be used to represent a logical "01", and a fourth state where substantially all of phase-change layer 2 is in the crystalline state can be used to represent a logical "00". In still other alternatives, further intermediate resistance states can be used to represent three bit data, four bit data, and so on.

The different intermediate states of phase-change layer 2 can be achieved by modifying the magnitude and width of pulse currents applied to phase-change layer 2 during programming. A downward slope of the pulse current influences the crystallization of phase-change layer 2, and can be used to control the resistance value of phase-change memory cell 1.

Figure 3:
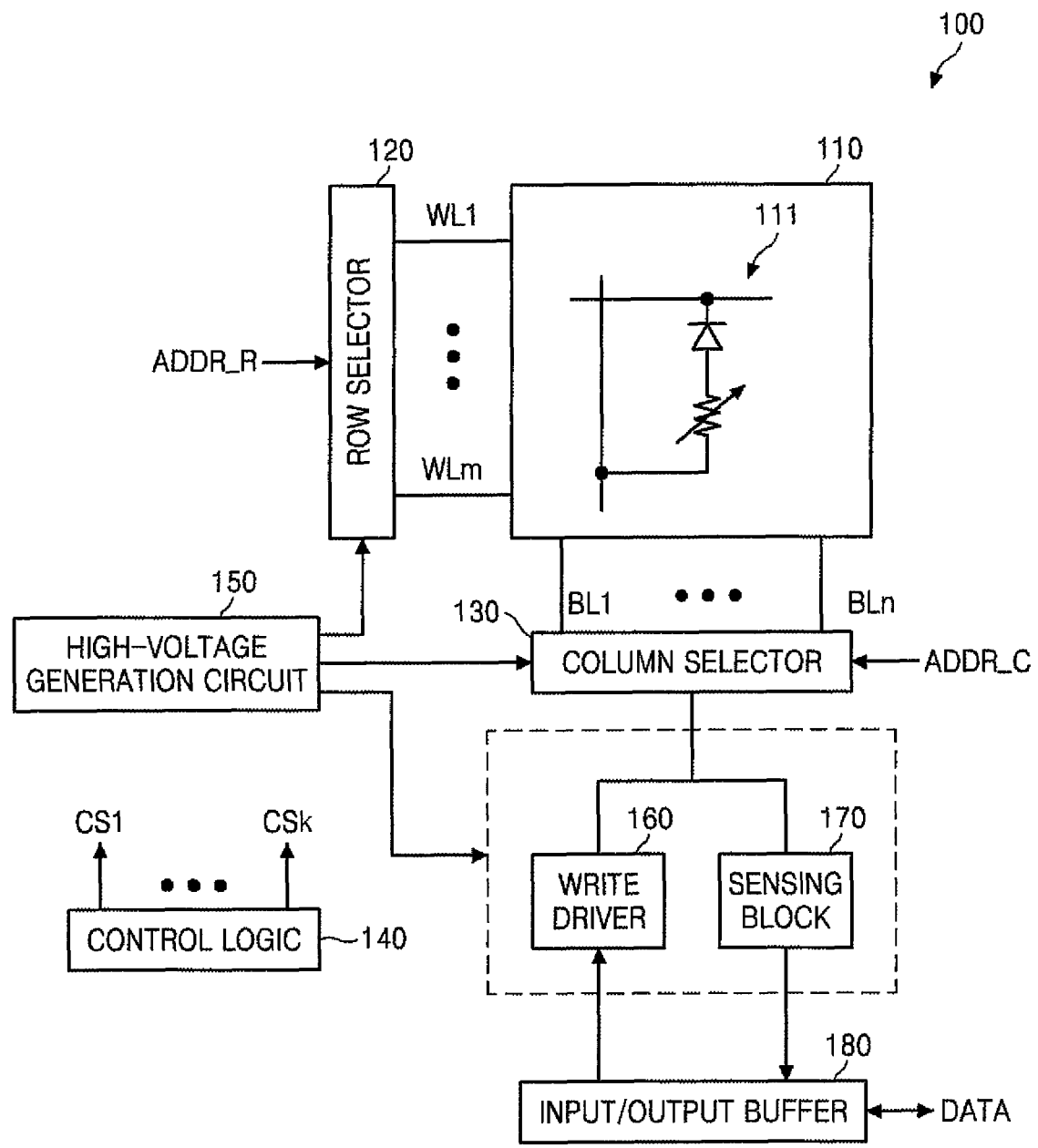
FIG. 3 is a block diagram of an MLC phase-change memory device according to an embodiment of the inventive concept.

FIG. 3 is a block diagram of an MLC phase-change memory device 100 according to an embodiment of the inventive concept.

Referring to FIG. 3, MLC phase-change memory device 100 comprises a phase-change memory cell array 110, a row selector 120, a column selector 130, control logic 140, a high-voltage generation circuit 150, a write driver 160, a sensing block 170, and an input/output buffer 180.

Although FIG. 3 shows only one phase-change memory cell 1 connected to a word line WL and a bit line BL, phase-change memory cell array 110 comprises a plurality of phase-change memory cells 1 arranged in a matrix. The plurality of phase-change memory cells 1 are connected to a plurality of word lines WL1 through WLm and a plurality of bit lines BL1 through BLn. As described above with reference to FIGS. 1 and 2, each phase-change memory cell 1 stores multiple bits based on a distribution of a resistance values.

Phase-change memory cell 1 corresponds to a group of addresses, where the number of addresses in the group corresponds to the number of bits that can be stored in phase-change memory cell 1. For instance, assuming that phase-change memory cell array 110 comprises three phase-change memory cells each storing 3-bit data, and data is stored at addresses 1 through 9, each phase-change memory cell can correspond to a group of three of addresses 1 through 9. In particular, a first phase-change memory cell can have a group of addresses 1, 2, and 3, a second phase-change memory cell can have a group of addresses 4, 5, and 6, and a third phase-change memory cell may have a group of addresses 7, 8, and 9.

Row selector 120 selects at least one of word lines WL1 through WLm in response to a row address ADDR_R. The selected word line is connected to a row of phase-change memory cells in phase-change memory cell array 110. Column selector 130 selects some of bit lines BL1 through BLn in response to a column address ADDR_C. Control logic 140 generates a plurality of control signals CS1 through CSk to control the operation of MLC phase-change memory device 100 in response to external commands.

High-voltage generation circuit 150 generates a plurality of high voltages used in row selector 120, column selector 130, write driver 160, and sensing block 170. High-voltage generation circuit 150 generates the high voltages by performing charge pumping based on a voltage applied to MLC phase-change memory device 100.

Input/output buffer 180 receives data DATA to be stored in MLC phase-change memory device 100, divides data DATA into data groups based on the number of bits that can be stored in phase-change memory cell 1, and outputs the data groups to write driver 160. For instance, where phase-change memory cell 1 stores 3 bits, input/output buffer 180 divides data DATA into data groups of 3 bits and outputs the data groups to write driver 160.

Write driver 160 receives a plurality of the data groups from input/output buffer 180 and generates a pulse current corresponding to a data value represented by bits in each data group. Where each data group has three bits, write driver 160 programs selected memory cells by generating one or more of eight different pulse currents corresponding to the eight possible 3-bit values "111", "110", "101", etc.

Write driver 160 generates a pulse current corresponding to a data value represented by bits in a data group by controlling a magnitude, a downward slope, or duration of the pulse current. The pulse current generated by write driver 160 is output to a selected phase-change memory cell 1 having a group of addresses corresponding to a program address of the received data group.

The resistance value of the selected phase-change memory cell 1 is changed into a resistance value corresponding to the data value of the data group based on the pulse current received from write driver 160. Accordingly, MLC phase-change memory device 100 programs multiple bits of data to the selected phase-change memory cell 1 using a single pulse current. Consequently, MLC phase-change memory device 100 can execute program operations more quickly than some conventional MLC memory devices.

In a read operation of a selected phase-change memory cell 1, sensing block 170 senses a bit line voltage of a bit line connected to the selected phase-change memory cell 1, compares the bit line voltage with a plurality of reference voltages, and identifies multi-bit data stored in the selected phase-change memory cell based on the comparison result. Through this operation, MLC phase-change memory device 100 can read all of the data in a multi-level cell with a single read operation. Consequently, MLC phase-change memory device 100 can execute read operations more quickly than some conventional MLC memory devices.

In addition to performing program and read operations in a relatively efficient manner as described above, MLC phase-change memory device 100 can also reduce power consumption by performing the program operations with a single pulse current, and performing read operations with a single bit line sensing operation.

Figure 4:
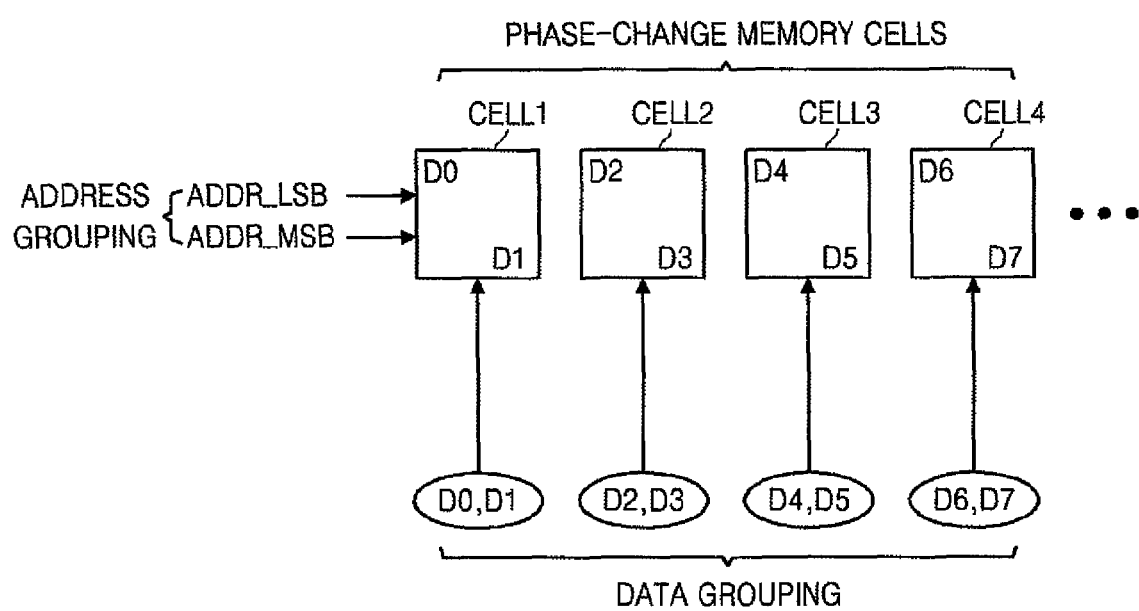
FIG. 4 is a conceptual diagram illustrating data grouping and address grouping used to program an MLC phase-change memory device according to an embodiment of the inventive concept.

FIG. 4 is a conceptual diagram illustrating data grouping and address grouping used to program an MLC phase-change memory device according to an embodiment of the inventive concept.

Referring to FIG. 4, each of phase-change memory cells CELL1 through CELL4 stores two-bit data. Eight-bit data D0 through D7 input to phase-change memory cell array 110 is divided into four data groups of two bits. Each of phase-change memory cells CELL1 through CELL4 has a group of two addresses ADDR_LSB and ADDR_MSB at which two bits in a data group are respectively stored.

Figure 5:
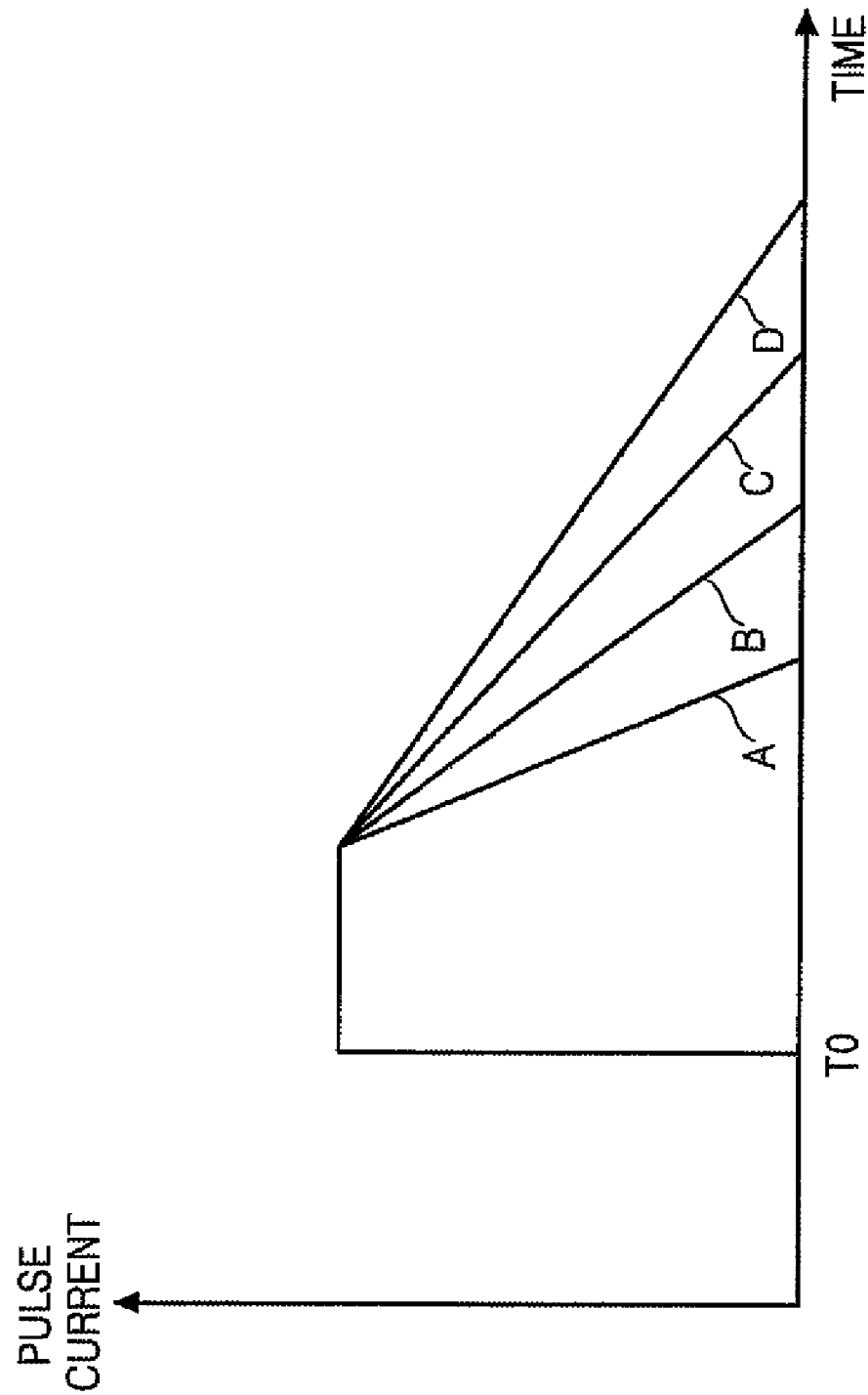
FIG. 5 is a graph illustrating a pulse current applied by a write driver to a phase-change memory cell according to an embodiment of the inventive concept.

FIG. 5 is a graph illustrating a pulse current applied by write driver 160 to phase-change memory cell 1 according to an embodiment of the inventive concept.

Referring to FIG. 5, a plurality of pulse current waveforms A through D have different downward slopes. Write driver 160 controls the degree of crystallization of phase-change layer 2 of phase-change memory cell 1 by changing the downward slope of the pulse current. Because phase-change memory cell 1 can have different resistance values according to the degree of crystallization of phase-change layer 2, write driver 160 can store multi-bit data in phase-change memory cell 1 based on the downward slope of the pulse current.

Figure 6:
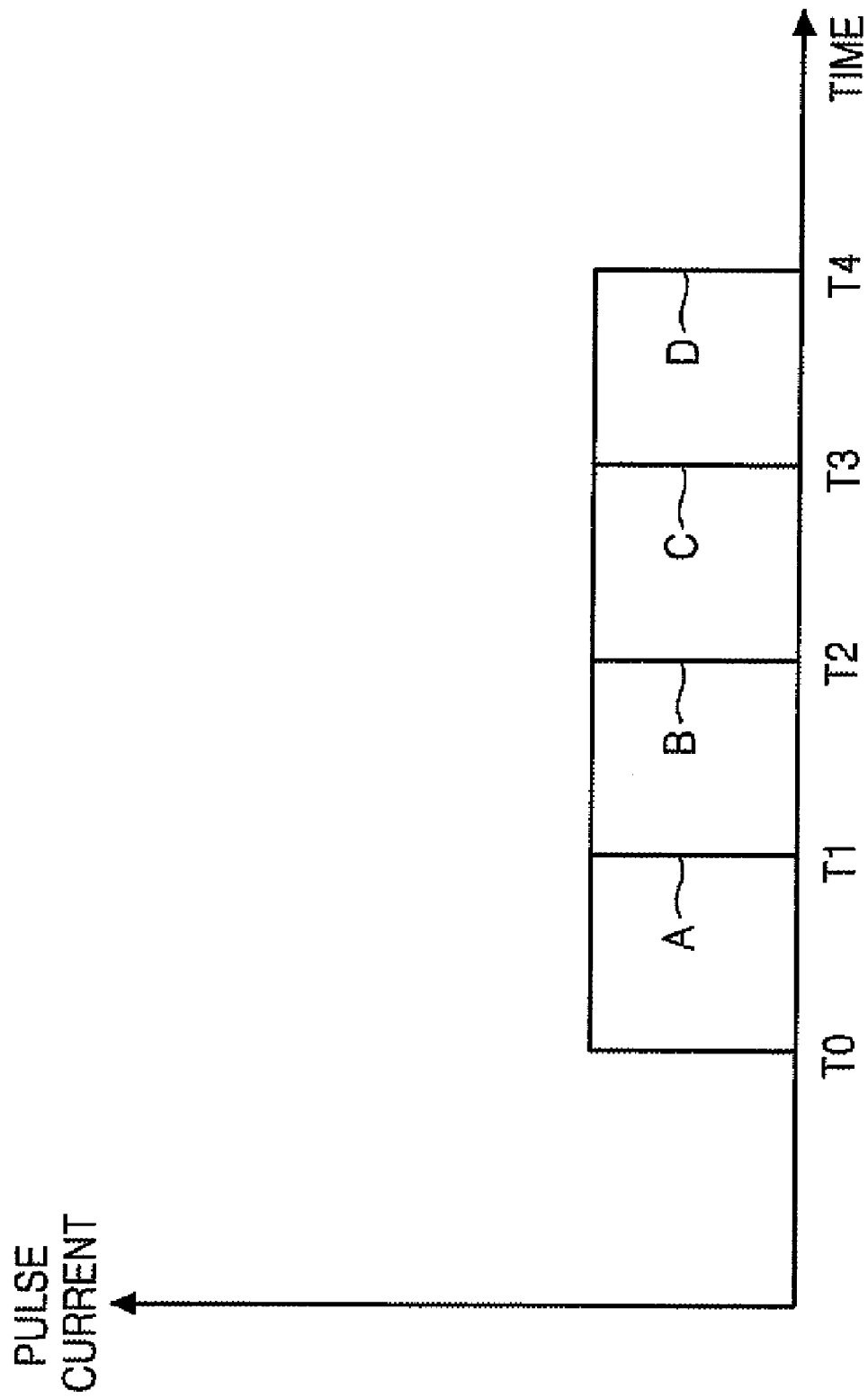
FIG. 6 is a graph illustrating a pulse current applied by a write driver to a phase-change memory cell according to another embodiment of the inventive concept.

FIG. 6 is a graph illustrating a pulse current applied by write driver 160 to phase-change memory cell 1 according to another embodiment of the inventive concept.

Referring to FIG. 6, a plurality of pulse current waveforms A through D have different durations. Write driver 160 controls the degree of crystallization of phase-change layer 2 of phase-change memory cell 1 by changing the duration of the pulse current. Because phase-change memory cell 1 can have different resistance values according to the degree of crystallization of phase-change layer 2, write driver 160 can store multi-bit data in phase-change memory cell 1 based on the duration of the pulse current.

Figure 7:
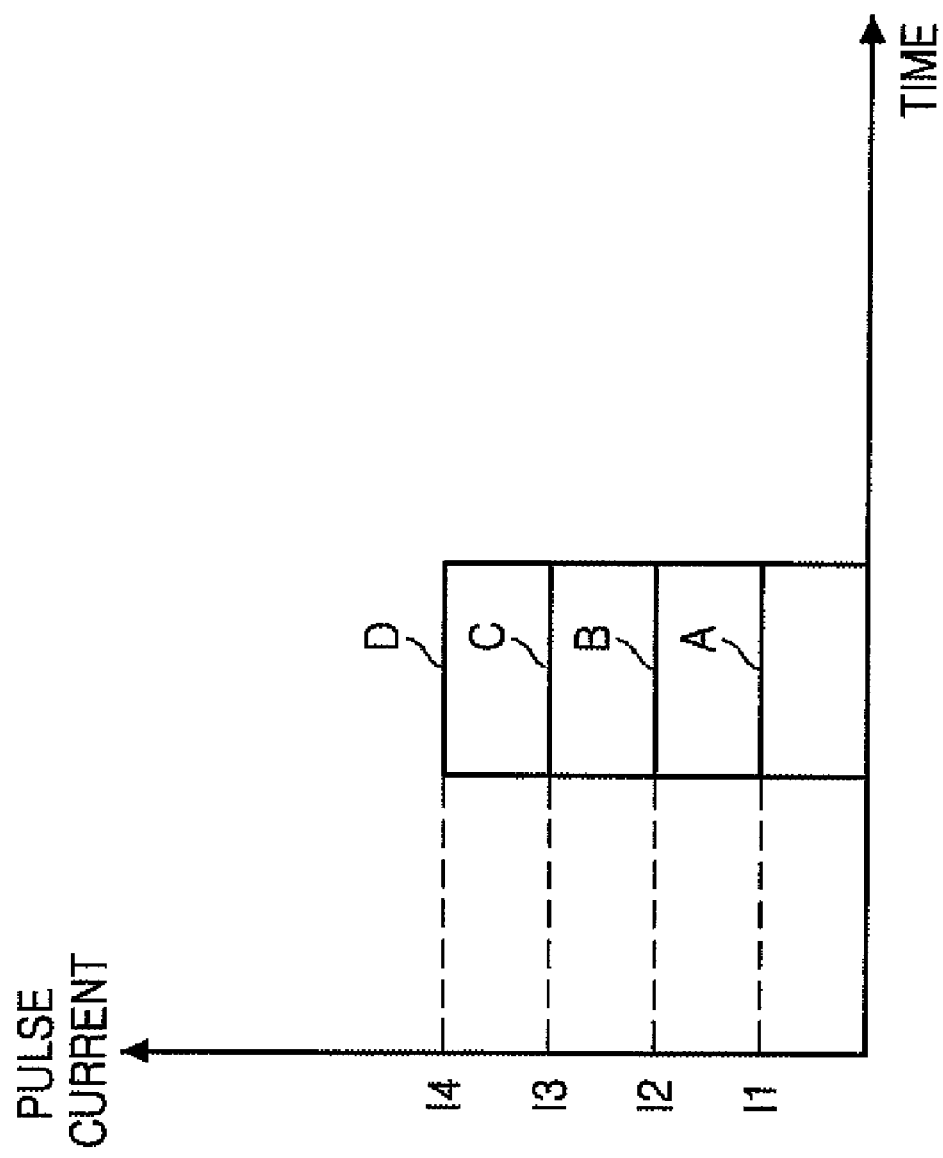
FIG. 7 is a graph illustrating a pulse current applied by a write driver to a phase-change memory cell according to still another embodiment of the inventive concept.

FIG. 7 is a graph illustrating a pulse current applied by write driver 160 to phase-change memory cell 1 according to still another embodiment of the inventive concept.

Referring to FIG. 7, a plurality of pulse current waveforms A through D have different magnitudes I1 through I4. Write driver 160 controls the degree of crystallization of phase-change layer 2 of phase-change memory cell 1 by changing the magnitude of the pulse current. Because phase-change memory cell 1 can have different resistance values according to the degree of crystallization of phase-change layer 2, write driver 160 can store multi-bit data in phase-change memory cell 1 based on the magnitude of the pulse current.

Figure 8:
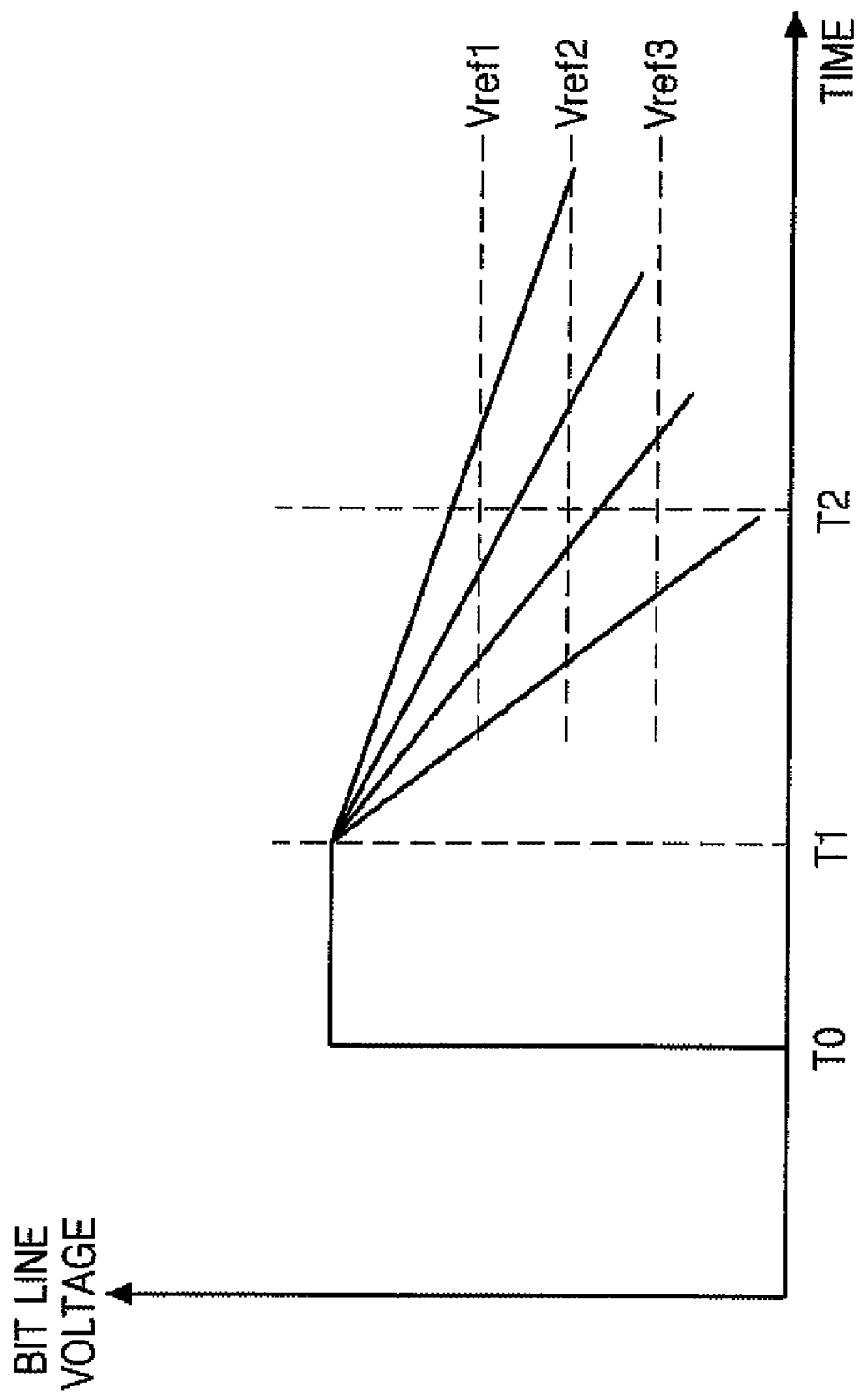
FIG. 8 is a graph illustrating a bit line voltage sensed by a sensing block during a read operation of a phase-change memory cell according to an embodiment of the inventive concept.
Figure 9:
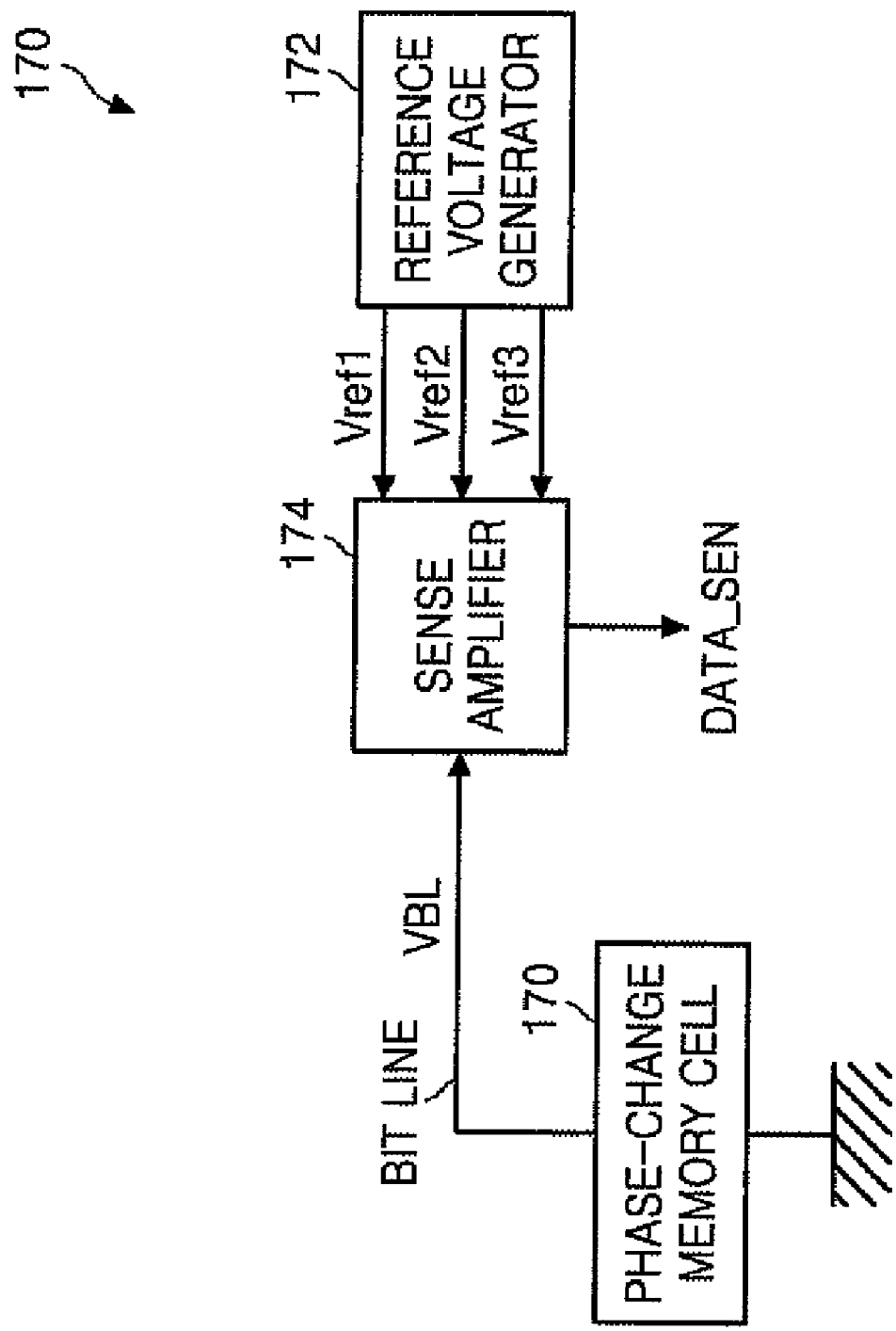
FIG. 9 is a block diagram of the sensing block according to an embodiment of the inventive concept.

FIG. 8 is a graph illustrating a bit line voltage sensed by sensing block 170 during a read operation of phase-change memory cell 1 according to an embodiment of the inventive concept, and FIG. 9 is a block diagram of sensing block 170 according to an embodiment of the inventive concept.

Referring to FIGS. 8 and 9, sensing block 170 comprises a reference voltage generator 172 and a sense amplifier 174. Reference voltage generator 172 generates a plurality of reference voltages Vref1, Vref2, and Vref3. Sense amplifier 174 compares a sensed bit line voltage VBL with reference voltages Vref1, Vref2, and Vref3 simultaneously and reads data DATA_SEN corresponding to addresses grouped for a phase-change memory cell based on the comparison. The read operation of sensing block 170 is described below in further detail with reference to FIGS. 8 and 9.

Referring to FIG. 8, a precharge voltage is applied to a bit line at a time T0. The bit line is maintained at the precharge voltage until a time T1 at which the bit line is connected to a phase-change memory cell. As current flows into the phase-change memory cell starting from time T1, a voltage of the bit line gradually decreases.

The bit line voltage can have one of various downward slopes because the phase-change memory cell connected with the bit line can have different resistance values.

At a time T2, sense amplifier 174 senses a voltage of the bit line and compares the sensed bit line voltage VBL simultaneously with reference voltages Vref1, Vref2, and Vref3 output from reference voltage generator 172, senses data of the phase-change memory cell based on the comparison, and outputs sensed data DATA_SEN.

MLC phase-change memory device 100 can be packed in various types of packages. These package types can include, for instance, package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), multi chip package (MCP), wafer-level fabricated package (WFP), and wafer-level processed stack package (WSP).

Figure 10:
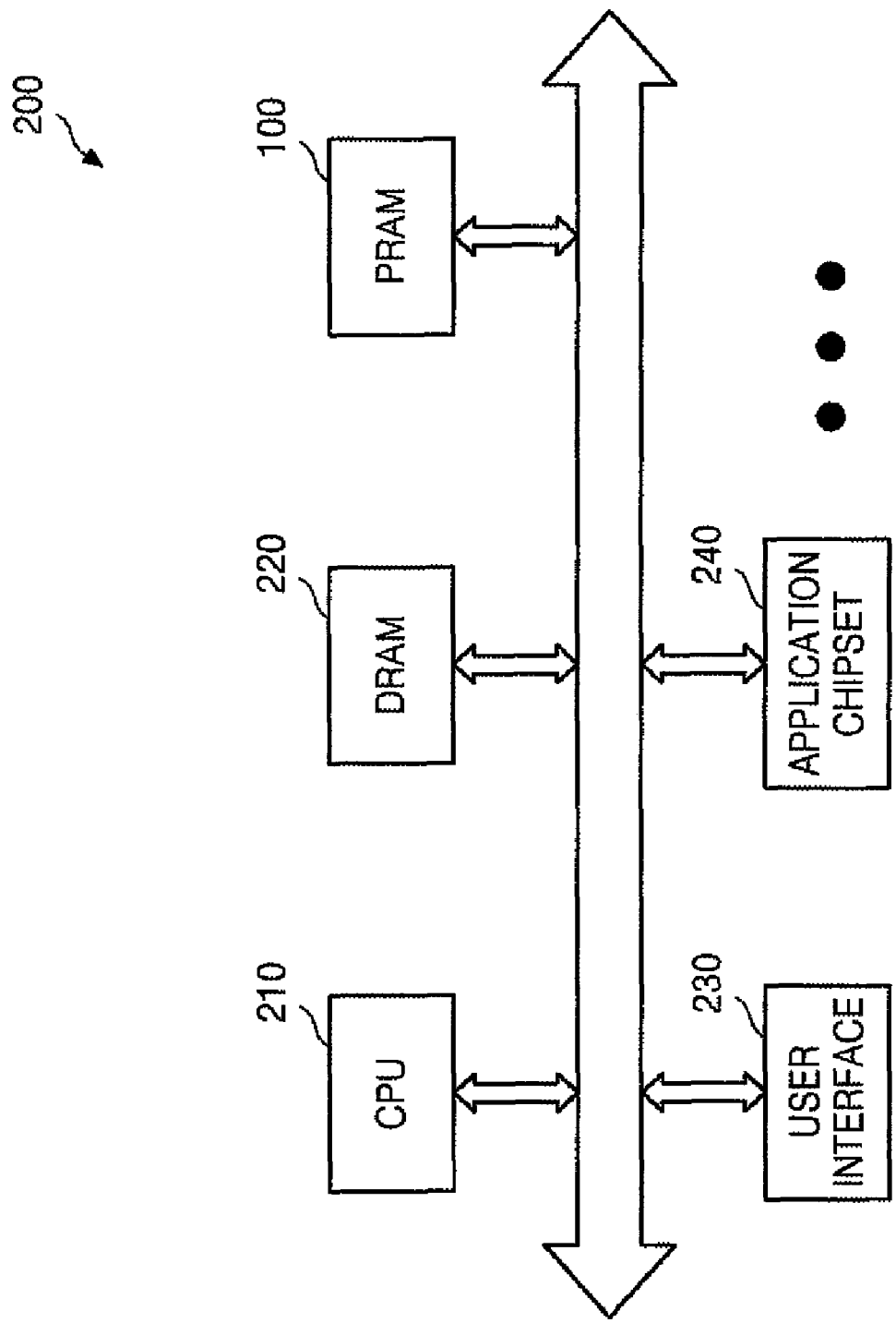
FIG. 10 is a block diagram of an electronic device comprising an MLC phase-change memory device according to an embodiment of the inventive concept.

FIG. 10 is a block diagram of an electronic device 200 comprising MLC phase-change memory device 100 according to an embodiment of the inventive concept.

Referring to FIG. 10, electronic device 200 comprises a central processing unit 210, a dynamic random access memory (DRAM) 220, MLC phase-change memory device 100 (which can be a phase-change random access memory (PRAM)), a user interface 230, and an application chipset 240, which are electrically connected to one another via a bus 205. In certain embodiments, electronic device 200 comprises a computing system such as a notebook computer or a personal computer, or a mobile device such as a cellular telephone, a personal digital assistant (PDA), a digital camera, a portable game console, or an MP3 player.

In various embodiments, MLC phase-change memory device 100 can be used to store code or data. In some embodiments, it replaces DRAM 220.

Figure 11:
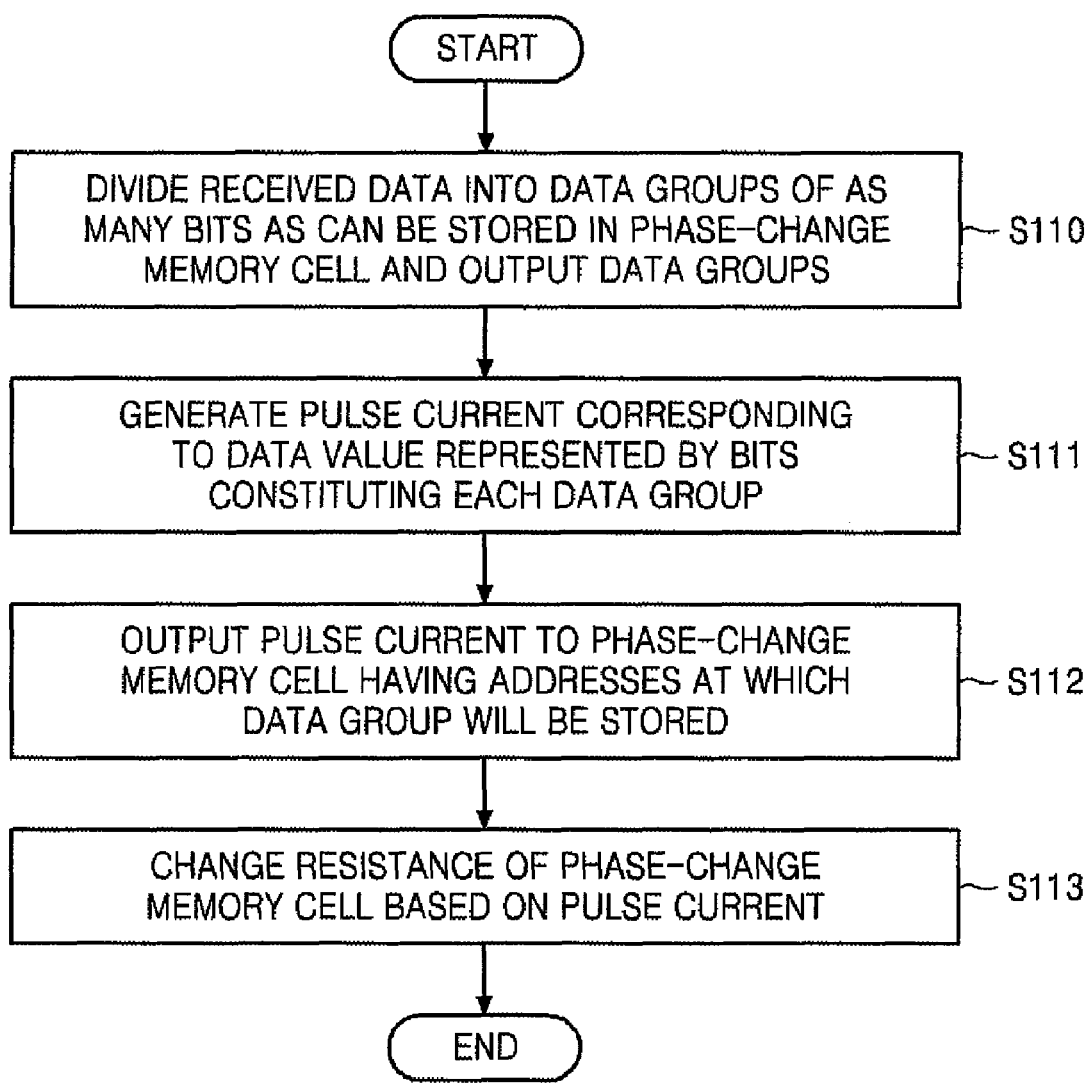
FIG. 11 is a flowchart of a method of operating an MLC phase-change memory device according to an embodiment of the inventive concept.

FIG. 11 is a flowchart illustrating a method of operating MLC phase-change memory device 100 according to an embodiment of the inventive concept. In particular, FIG. 11 illustrates a method of performing a program operation in MLC phase-change memory device 100. The program operation of MLC phase-change memory device 100 will be sequentially described with reference to FIGS. 3 and 11. In the description that follows, example method steps will be indicated by parentheses (SXXX).

In the method of FIG. 11, input/output buffer 180 receives data to be stored in phase-change memory cell array 110, divides the data into data groups each having the same number of bits as the number of bits that can be stored in each phase-change memory cell 1, and outputs the data groups (S110).

Next, write driver 160 generates a pulse current corresponding to a data value represented by bits in a data group received from input/output buffer 180 (S111) and outputs the pulse current to a selected phase-change memory cell 1 having a group of addresses corresponding to the data group (S112).

In response to the pulse current output from write driver 160, a resistance of the selected phase-change memory cell 1 is changed to store data in the data group (S113).

Figure 12:
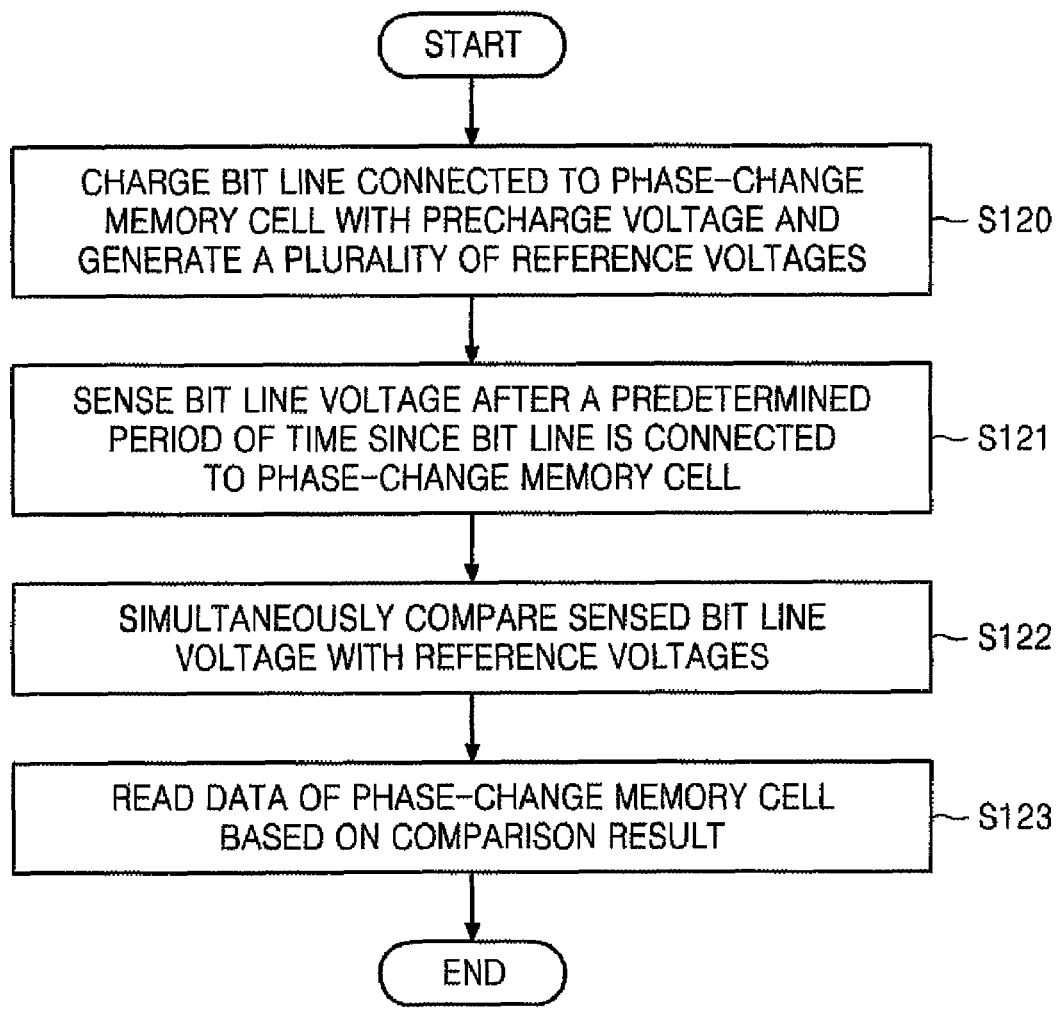
FIG. 12 is a flowchart illustrating a method of operating an MLC phase-change memory device according to another embodiment of the inventive concept.

FIG. 12 is a flowchart illustrating a method of operating MLC phase-change memory device 100 according to another embodiment of the inventive concept. In particular, FIG. 12 illustrates a method of performing a read operation in MLC phase-change memory device 100. The read operation of MLC phase-change memory device 100 will be sequentially described with reference to FIGS. 3, 9, and 12 below.

In the method of FIG. 12, a bit line connected to phase-change memory cell 1 is charged with a precharge voltage, and reference voltage generator 172 generates a plurality of reference voltages Vref1, Vref2, and Vref3 (S120). Next, sense amplifier 174 senses a voltage of the bit line when a predetermined period of time has elapsed since the bit line was connected to phase-change memory cell 1 (S121).

Thereafter, sense amplifier 174 simultaneously compares the sensed bit line voltage VBL with reference voltages Vref1, Vref2, and Vref3 (S122) and senses and outputs data stored in phase-change memory cell 1 based on the comparison (S123). The data sensed by sense amplifier 174 is output from MLC phase-change memory device 100 via input/output buffer 180.

As indicated by the foregoing, certain embodiments of the inventive concept can improve the read and programming speed of MLC phage-change memory devices while decreasing power consumption. Moreover, various embodiments can be implemented in hardware, software, firmware, or combinations thereof. Certain embodiments can be implemented as computer readable codes or programs stored on a computer readable recording medium. Examples of computer readable recording media include read-only memory (ROM), random-access memory (RAM), EEPROM, and flash memory. The computer-readable recording medium can also be distributed over network of computer systems so that the computer-readable code is stored and executed in a distributed fashion.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A multi-level cell (MLC) phase-change memory device comprising:
    a phase-change memory cell array comprising a plurality of phase-change memory cells each configured to store multiple bits of data using variable resistance characteristics of a phase change material;
    an input/output buffer configured to receive data to be stored in the phase-change memory cell array, divide the data into data groups each comprising multiple bits, and output the data groups; and
    a write driver configured to generate a pulse current with a pulse current characteristic corresponding to a data value of one of the data groups, and to output the pulse current to a selected phase-change memory cell in the phase-change memory cell array.

2. The MLC phase-change memory device of claim 1, wherein the pulse current characteristic is a pulse current magnitude.

3. The MLC phase-change memory device of claim 1, wherein the pulse current characteristic is a downward slope.

4. The MLC phase-change memory device of claim 1, wherein the pulse current characteristic is a pulse current duration.

5. The MLC phase-change memory device of claim 1, wherein the phase-change memory cells each store two-bit data, and the pulse current characteristic has four different states that can be used to store four different values of the two-bit data.

6. The MLC phase-change memory device of claim 1, further comprising a sensing block configured to sense a voltage of a bit line connected to the selected phase-change memory cell, simultaneously compare the sensed voltage with a plurality of reference voltages, and identify data stored in the selected phase-change memory cell based on the comparison.

7. The MLC phase-change memory device of claim 6, wherein the sensing block senses the voltage of the bit line following a predetermined time interval after the bit line is connected to the selected phase-change memory cell.

8. The MLC phase-change memory device of claim 6, wherein the sensing block comprises:
    a reference voltage generator configured to generate the plurality of reference voltages; and
    a sense amplifier configured to simultaneously compare the sensed voltage with the plurality of reference voltages and sense and output the data stored in the selected phase-change memory cell based on the comparison.

9. The MLC phase-change memory device of claim 6, wherein each bit of data stored in the selected phase-change memory cell has a distinct address.

10. The MLC phase-change memory device of claim 1, wherein the phase change material comprises a chalcogenide alloy of germanium, antimony and tellurium.

* * * * *